United States Patent [19]

Brunner-Schwer

[11] 4,222,119
[45] Sep. 9, 1980

[54] MULTI-PURPOSE RADIO

[75] Inventor: Hermann Brunner-Schwer, Stein am Rhein, Switzerland

[73] Assignee: Rhen Beteiligungs-und Finanzierungs-AG, Stein am Rhein, Switzerland

[21] Appl. No.: 935,981

[22] Filed: Aug. 22, 1978

[30] Foreign Application Priority Data

Mar. 10, 1978 [DE] Fed. Rep. of Germany ....... 2810500

[51] Int. Cl.² .................. H04B 1/16; H04B 11/00
[52] U.S. Cl. .................................. 455/140; 340/546; 367/93; 455/229; 455/350
[58] Field of Search ............... 325/310, 312, 314, 352, 325/361, 364, 392, 393, 466, 395, 396, 303, 302; 340/546, 541, 565, 566, 567, 600, 693, 554; 367/90, 93, 94; 343/5 PD

[56] References Cited

U.S. PATENT DOCUMENTS

| 1,965,946 | 7/1934 | Pincus et al. | 344/546 |
| 2,950,356 | 8/1960 | Stott | 325/310 |
| 3,087,990 | 4/1963 | Jacob et al. | 325/310 |
| 3,231,852 | 1/1966 | Kritz | 325/310 |
| 3,720,937 | 3/1973 | Lang et al. | 340/546 |
| 3,908,180 | 9/1975 | Braginsky | 325/310 |
| 4,015,237 | 3/1977 | Takatani et al. | 325/312 |

*Primary Examiner*—Marc E. Bookbinder
*Attorney, Agent, or Firm*—Darby & Darby

[57] ABSTRACT

A multi-purpose radio of the AC or battery operated type which includes connections for an auxiliary unit which is an alarm device of the ultrasonic type in which the transducers of the alarm device are mounted on the radio cabinet. The output of the alarm device is applied to the audio frequency amplifier section of the radio.

13 Claims, 2 Drawing Figures

MULTI-PURPOSE RADIO

The invention relates to a multi-purpose radio, particularly to an a-c or battery-operated portable radio, with a supply, audio or low frequency (LF) amplifier and loud-speaker unit, where the supply and LF amplifier unit are equipped with connecting elements for connection to other assemblies.

Such a radio is known, where the other assembly is substantially a unit for receiving and/or reproducing information on tape. It is also known to connect the above-mentioned radio in a suitable manner with a record player. The invention is based on the problem of increasing the possible used of the radio, particularly of providing a space-saving, relatively inexpensive multiple-purpose radio which satisfies the new purpose of the radio in a special way.

This problem is solved in a multiple-purpose radio of the above-mentioned type, in this way that the assembly of an alarm device, not comprising the amplifier and alarm sound unit, is arranged in the radio cabinet, with connecting pieces adapted to the connecting elements being attached to the assembly.

This solution has not only the advantage that a radio, particularly a portable radio, if desired with a recording tape unit, can be used as an alarm device or "warning radio," but also that due to the spatial arrangement of the alarm assembly inside the radio cabinet, the requirements for an alarm device are satisfied in a particularly favorable manner, because the warning radio according to the invention works just as well as any other alarm device of comparable size, and it has the additional advantage that its alarm assembly or design as an alarm device can not be recognized from the outside.

It is known from German Utility Model No. 7,317,711 to camouflage an alarm device by arranging it in a loudspeaker cabinet. But in the solution of that patent the alarm device remains a separate unit. Compared to the solution according to the invention, the device of the German Utility Model has the disadvantage that the advantages of a multi-purpose radio cannot be combined with the advantage of a particularly favorable camouflage of at least one part of the device.

Further, the device known from German Utility Model No. 7,317,711 is not designed as an easily transportable alarm device, which can be taken along comfortably, like the device according to the invention, in the car, to the swimming pool, camping site, hotel room, etc.

In accordance with the present invention, the connecting elements of the radio and the connecting pieces of the alarm assembly are preferably designed as plug contacts, so that they can be easily disengaged.

If the alarm assembly is a part of an ultrasonic alarm device, that is, if it has at least two ultrasonic transducers, namely an ultrasonic energy transmitter and an ultrasonic receiver, these ultrasonic transducers are preferably so secured on the front wall of the radio cabinet that their energy transmitting/receiving surfaces are flush with the outside of the front wall of the radio cabinet. The camouflaging effect can be further increased if the energy sound transmitting/receiving surface is flush with the outside of this wall, or while the other ultrasonic transducer is arranged in front of or on the inside of the radio cabinet wall. Naturally, at least that part of the cabinet wall must be permeable to ultrasound which is directly in front of the ultrasonic transducer whose sound transmitting/receiving surface is in front of or on the inner surface of the radio cabinet wall. This arrangement has not only the advantage that the respective offset ultrasonic transducer is better protected against mechanical damage, but, also, that the camouflaging effect is increased, because if the viewer sees only one sound transmitting-receiving surface, he will consider this surface rather as the front part of a microphone or loudspeaker arranged in the radio. Such an arrangement of microphones or loudspeakers in the radio cabinet is quite customary, but not the arrangement of only a single ultrasonic transducer, since an ultrasonic alarm device has at least two ultrasonic transducers.

Naturally it is also possible to arrange both ultrasonic transducers on the inner surface of the radio cabinet so that they are invisible from the outside.

The alarm assemblies of alarm devices are frequently provided with at least one controllable time switch. The part controlling this time switch is preferably designed as a rotary lever, or knob, which projects from the wall of the radio cabinet so that corresponding time delays for the response or the start of the alarm unit can be readily set from the outside. This rotary lever is preferably designed as a wheel.

Furthermore the alarm assemblies of alarm devices are frequently equipped with a restricted access switch for turning the alarm device on or off. This restricted access switch is preferably designed as a safety lock whose front side is flush with the outside of a cabinet wall.

An embodiment of the invention will be described more fully on the basis of the attached schematic representations.

Figure 1:
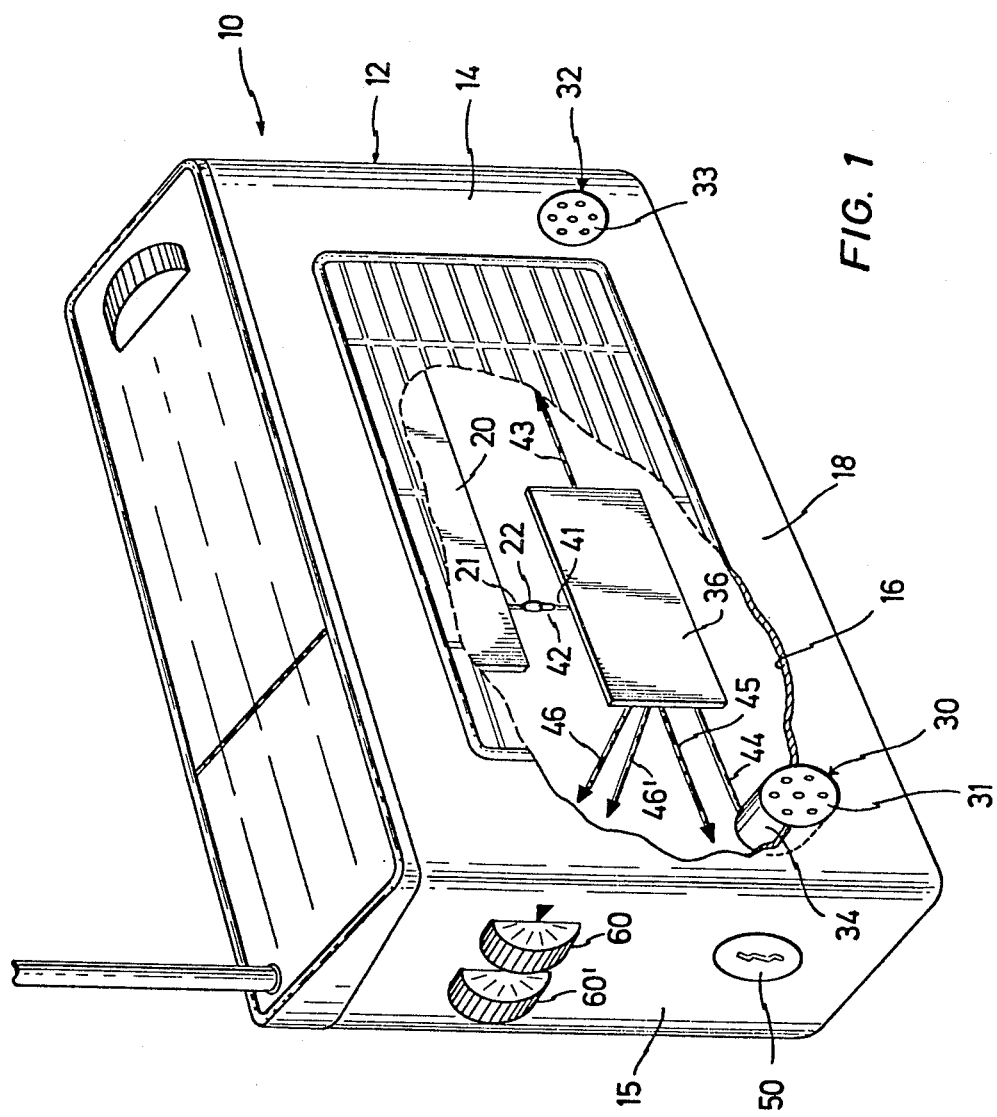
FIG. 1 shows a perspective view of an embodiment, partly in an elevation.

According to FIG. 1, cabinet 12 of a radio 10 has a front wall 14 with outer surface 18 and inner surface 16, as well as a side wall 15. Furthermore a LF amplifier 20, a loudspeaker connected with it, and a supply unit are provided in radio 10, as usual. LF amplifier 20 is connected over an electrical line 21 by a connecting element designed as a plug-socket 22. In the same manner the supply unit (not shown) of radio 10 is equipped with a connecting element. The radio circuits, i.e. RF, IF and detector circuits are also located within the cabinet and these can be of the AM or AM/FM type. An antenna A is shown as is a tuning control T which drives a pointer P across a scale S to indicate the station tuned. A volume control (not shown) is on the right side of the cabinet.

On front wall 14 of radio cabinet 12 are secured two ultrasonic transducers 30 and 32 of an assembly of an alarm device, not comprising the amplifier, and the alarm sound unit. The two ultrasonic transducers 30 and 32 are so secured on front wall 14 that their ultrasonic sound transmitting/receiving surfaces 31, 33 are flush with the outer surface 18 of front wall 14, and the remaining tubular part, or casing, 34 of the ultrasonic transducers protrudes into the interior of radio cabinet 12. Such a fastening arrangement of the ultrasonic transducers 30 and 32 has the advantage it ensures a maximum angle of radiation. As indicated above, one of the transducers can be recessed within the cabinet and an opening provided with a covering such as a cloth, which is permeable to ultrasonic energy. Also, one of the transducers can be mounted with its head in front of the cabinet front wall.

The ultrasonic transducers 30 and 32 are connected over electrical lines 44, 43 in known manner with control unit 36 for an alarm device. Control unit 36 can consist substantially of a printed circuit (FIG. 2) having the necessary components. On control unit 36 is secured a plug-type connecting piece 42 over an electrical line 41. The plug-type connecting piece 42 is so designed that it can be plugged into socket 22.

Control unit 36 is also connected over an electrical line 46, 46' to two controllable time switches 200 and 300 (FIG. 2) and over an additional electrical line 45 to a restricted access switch 50, shown as a key actuator on the side of the cabinet. The parts controlling the time switches 200 and 300 are designated as knobs 60, 60', which project from side wall 15 of the radio cabinet and have a scale which permits the reading and the setting of the time delays.

The key switch 50 is designed as a safety lock, which is flush with the outside of side wall 15 of radio cabinet 12. By means of the key switch or safety lock 50, the alarm unit can be coupled with or uncoupled from the remaining part of the radio, or be switched on and off. Safety lock 50 ensures that only authorized persons can switch the alarm device on and off.

Figure 2:
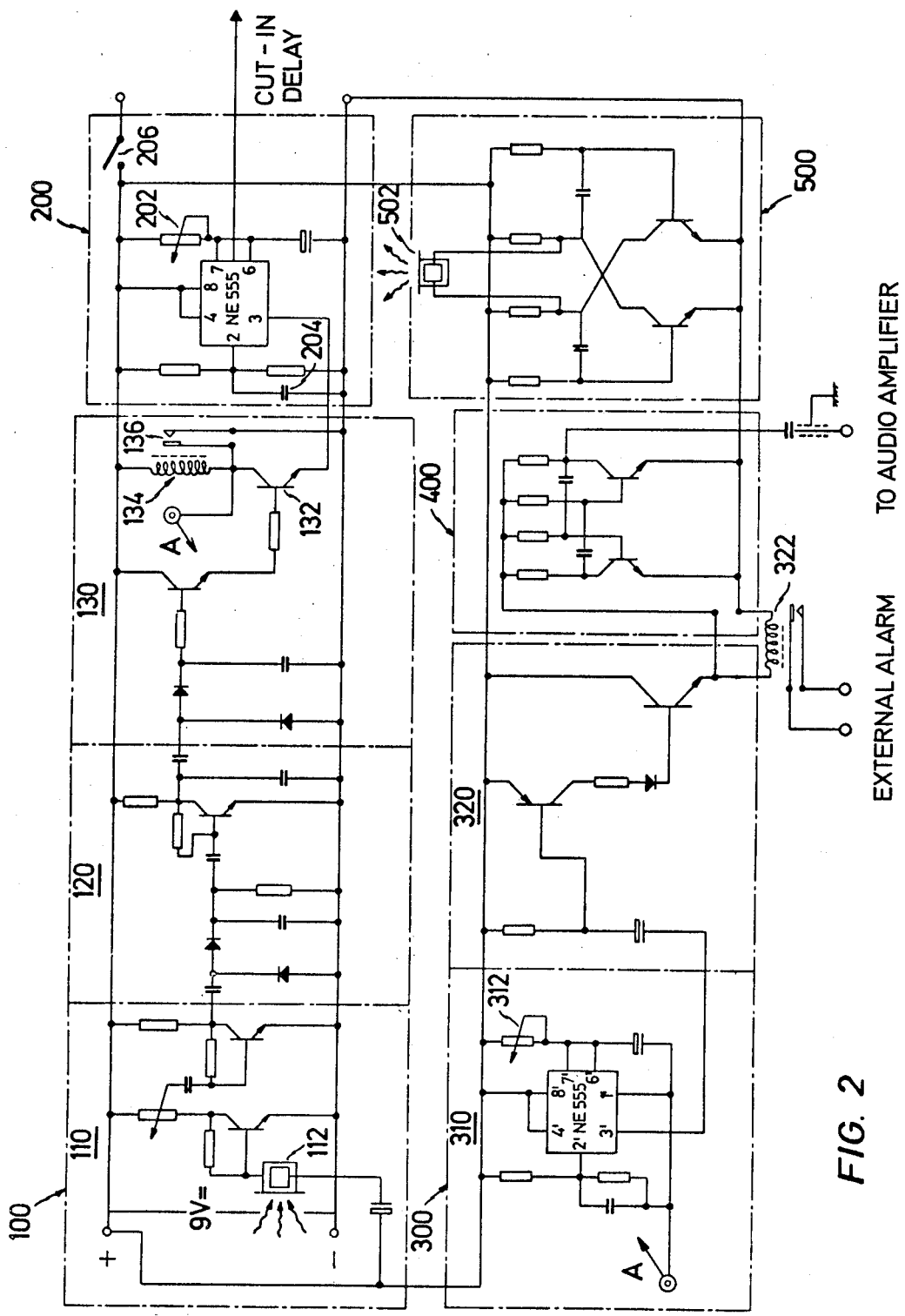
FIG. 2 shows an embodiment of a wiring diagram.

According to FIG. 2, the circuit of the alarm assembly of the "warning radio" is designed as follows: Part 100 of the circuit, circled with dot-dashed lines, comprises a 2- stage receiving (amplifier) unit 110, with input (receiving) ultrasonic transducer 112, detector 120 and amplifier 130.

A closing delay circuit, or time controlled switch, 200 is formed by a timer, illustrated at the NE 555 or similar type, with a timing control, shown as resistor 202, which delay can be fixed or adjustable by means of knob 60.

If a switch 206, which is in the positive voltage supply line, is turned on by means of key actuated member 50, output 3 of the timer becomes immediately positive, since trigger input 2 is grounded over a capacitor 204. After a time which has been determined by control circuit 202, for example, 8–15 seconds, output 3 returns to ground potential, so that the emitter of output transistor 132 of amplifier 130 of receiving unit 100 is at ground potential. Thereafter the receiving unit is able to conduct in response to (transmit) an alarm (intruder) signal which arrives at the base of the first transistor from input ultrasonic transducer 112. This conduction is not possible as long as output 3 of the timer is positive. Between the collector of output transistor 132 and the source of positive potential is connected a relay coil 134 which actuates a holding contact 136 which holds output point A at ground potential once the alarm has been triggered. Point A will stay at ground potential or until the alarm unit is shut off by means of restricted access switch 50 which can actuate switch 206.

Output point A is connected to trigger input 2' of an additional timer NE 555 arranged in an shutoff delay circuit 300 which determines the time interval for the shutoff delay. The timing control, a potentiometer 312, is controlled by the knob 60'. Shutoff delay circuit 300 comprises a relay holding circuit 320.

To the output of shutoff delay circuit 300 and holding circuit 320, is connected an audio frequency generator 400, shown as a multivibrator circuit which transmits the alarm signal to LF amplifier 20 of radio 10. When point A of amplifier 130 goes to ground in response to an intruder signal, the output 3' of the NE 555 of 310 goes high. This produces an output from the final transistor of the holding circuit 320 to the base and emitter electrodes of the transistors of the audio generator 400. The alarm will be produced for a time as set by control 312.

Between holding circuit 320 and audio frequency generator 400 is arranged, if necessary, an additional relay coil 322 for actuating an outside alarm.

Finally the circuit comprises a transmitter 500 with an output ultrasonic transducer 502.

What is claimed is:

1. A combined radio receiver and alarm comprising a radio cabinet,
   power supply means within said cabinet
   radio receiver means with said cabinet, said radio receiver means including audio frequency amplifier means and loudspeaker means connected to said audio frequency amplifier means,
   alarm means including an ultrasonic transmitter and ultrasonic receiver means, located entirely within said cabinet, and
   switching means which when placed in a first state electrically connecting said alarm means to said power supply means and said audio frequency amplifier means to activate said alarm means, said switching means including delay means which prevents the activation of said alarm means for a predetermined time after said switching means has been placed in said first state.

2. A combined radio receiver and alarm as in claim 1 wherein said alarm means includes amplifier means coupled to said ultrasonic receiver for amplifying the signals received thereby, said delay means including means for blocking the operation of said amplifier means during said predetermined time.

3. A combined radio receiver and alarm as in claim 1 further comprising means accessible from the outside of the radio cabinet for controlling predetermined time of inactivity of the alarm means as set by said delay means.

4. A combined radio receiver and alarm as in claim 1 further comprising plug means for connecting said audio frequency amplifier means to said loudspeaker means.

5. A combined radio receiver and alarm as in claim 1 wherein said ultrasonic transmitter and receiver means includes at least one transducer means which is mounted adjacent a wall of the cabinet.

6. A combined radio receiver and alarm as in claim 5 wherein said transducer means is mounted inwardly of the wall of the cabinet.

7. A combined radio receiver and alarm as in claim 5 wherein said transducer means is mounted substantially flush with the outer surface of said wall of said cabinet.

8. A combined radio receiver and alarm as in claim 5 wherein there are two ultrasonic tranducer means, one for the transmitter and the other for the receiver, which are mounted adjacent a wall of said cabinet.

9. A combined radio receiver and alarm as in claim 8 wherein said two transducer means are mounted at the lower corners of the first wall of the cabinet.

10. A combined radio receiver and alarm as in claim 3 wherein said accessible means for controlling the time delay comprises a knob.

11. A combined radio receiver and alarm as in claim 1 wherein said switching means comprises key actuated means.

12. A combined radio receiver and alarm as in claim 11 when said key actuated means is mounted on a wall of said cabinet accessible from outside of said cabinet.

13. A combined radio receiver and alarm as in claim 11 when said key actuated means is flush with the wall of the cabinet.

* * * * *